United States Patent
Takai et al.

(10) Patent No.: US 10,491,187 B2
(45) Date of Patent: Nov. 26, 2019

(54) ELASTIC WAVE DEVICE, MULTIPLEXER, HIGH-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventors: Tsutomu Takai, Nagaokakyo (JP); Koji Yamamoto, Nagaokakyo (JP); Hideki Iwamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/244,143

(22) Filed: Jan. 10, 2019

(65) Prior Publication Data

US 2019/0260347 A1    Aug. 22, 2019

(30) Foreign Application Priority Data

Feb. 16, 2018    (JP) .................. 2018-025832

(51) Int. Cl.
  *H03H 9/02*    (2006.01)
  *H03H 9/13*    (2006.01)
  (Continued)

(52) U.S. Cl.
  CPC ......... *H03H 9/02086* (2013.01); *H03F 3/245* (2013.01); *H03H 9/02062* (2013.01); *H03H 9/02102* (2013.01); *H03H 9/131* (2013.01); *H03H 9/54* (2013.01); *H03H 9/703* (2013.01); *H04B 1/40* (2013.01); *H03F 2200/165* (2013.01); *H03F 2200/171* (2013.01);
  (Continued)

(58) Field of Classification Search
  CPC ............... H03F 3/245; H03H 9/02062; H03H 9/02102; H03H 9/131; H03H 9/54; H03H 9/703; H04B 1/40
  See application file for complete search history.

(56) References Cited

U.S. PATENT DOCUMENTS 4,482,833 A * 11/1984 Weinert .................. C23C 14/10
                                                310/313 A
6,445,265 B1 * 9/2002 Wright ..................... H03H 3/08
                                                29/25.35
(Continued)

FOREIGN PATENT DOCUMENTS

WO    2012/086639 A1    6/2012

*Primary Examiner* — Devan A Sandiford
(74) *Attorney, Agent, or Firm* — Keating & Bennett, LLP (57) ABSTRACT

An elastic wave device includes a supporting substrate, a high-acoustic-velocity film disposed on the supporting substrate, a low-acoustic-velocity film disposed on the high-acoustic-velocity film, a piezoelectric layer disposed on the low-acoustic-velocity film, and an interdigital transducer electrode disposed on the piezoelectric layer. The acoustic velocity of a bulk wave that propagates through the high-acoustic-velocity film is higher than the acoustic velocity of an elastic wave that propagates through the piezoelectric layer. The acoustic velocity of a bulk wave that propagates through the low-acoustic-velocity film is lower than the acoustic velocity of an elastic wave that propagates through the piezoelectric layer. The high-acoustic-velocity film is composed of $SiN_x$, where x<about 0.67.

20 Claims, 5 Drawing Sheets

(51) Int. Cl.
*H03H 9/70* (2006.01)
*H03H 9/54* (2006.01)
*H03F 3/24* (2006.01)
*H04B 1/40* (2015.01)

(52) U.S. Cl.
CPC .. *H03F 2200/294* (2013.01); *H03F 2200/451* (2013.01); *H03H 9/02031* (2013.01)

(56) References Cited

U.S. PATENT DOCUMENTS

| | | | | |
|---|---|---|---|---|
| 7,105,980 B2* | 9/2006 | Abbott | | H03H 3/08 |
| | | | | 310/313 A |
| 7,474,033 B2* | 1/2009 | Oshio | | H03H 3/10 |
| | | | | 310/313 A |
| 9,431,996 B2* | 8/2016 | Watanabe | | H03H 9/0222 |
| 10,158,342 B1* | 12/2018 | Takamine | | H01L 23/66 |
| 2002/0060616 A1* | 5/2002 | Jang | | H01P 1/2053 |
| | | | | 333/134 |
| 2002/0067225 A1* | 6/2002 | Jang | | H01P 1/2053 |
| | | | | 333/134 |
| 2002/0190814 A1* | 12/2002 | Yamada | | B06B 1/0644 |
| | | | | 333/187 |
| 2004/0113720 A1* | 6/2004 | Komuro | | H03H 3/04 |
| | | | | 333/133 |
| 2004/0164645 A1* | 8/2004 | Oshio | | H03H 3/08 |
| | | | | 310/313 B |
| 2005/0264378 A1* | 12/2005 | Jang | | H01P 1/2088 |
| | | | | 333/202 |
| 2007/0285191 A1* | 12/2007 | Jacobsen | | H03H 3/04 |
| | | | | 333/187 |
| 2008/0061657 A1* | 3/2008 | Matsuda | | H03H 9/0038 |
| | | | | 310/334 |
| 2008/0157629 A1* | 7/2008 | Noguchi | | B41J 2/161 |
| | | | | 310/313 R |
| 2009/0045703 A1* | 2/2009 | Barber | | H03H 3/02 |
| | | | | 310/364 |
| 2009/0085429 A1* | 4/2009 | Nishiyama | | H03H 9/02559 |
| | | | | 310/313 A |
| 2010/0008664 A1* | 1/2010 | Ramachandran | .. | G02B 6/02019 |
| | | | | 398/28 |
| 2010/0038993 A1* | 2/2010 | Umeda | | H03H 9/02574 |
| | | | | 310/313 B |
| 2010/0187947 A1* | 7/2010 | Mimura | | H03H 9/0222 |
| | | | | 310/313 A |
| 2010/0219717 A1* | 9/2010 | Takai | | H03H 9/02937 |
| | | | | 310/313 C |
| 2011/0080233 A1* | 4/2011 | Petit | | H03H 9/02102 |
| | | | | 333/187 |
| 2011/0133859 A1* | 6/2011 | Khelif | | H03H 3/04 |
| | | | | 333/195 |
| 2012/0262246 A1* | 10/2012 | Yasuda | | H03H 9/0038 |
| | | | | 333/5 |
| 2013/0027153 A1* | 1/2013 | Shin | | H03H 9/02102 |
| | | | | 333/133 |
| 2013/0285768 A1 | 10/2013 | Watanabe et al. | | |
| 2014/0144237 A1* | 5/2014 | Komatsu | | G01N 29/022 |
| | | | | 73/579 |
| 2014/0203893 A1* | 7/2014 | Kando | | H03H 9/02574 |
| | | | | 333/187 |
| 2015/0102705 A1* | 4/2015 | Iwamoto | | H03H 9/0222 |
| | | | | 310/313 B |
| 2016/0261249 A1* | 9/2016 | Takamine | | H03H 9/6483 |
| 2016/0277003 A1* | 9/2016 | Kikuchi | | H03H 3/08 |
| 2016/0294354 A1* | 10/2016 | Saijo | | H03H 9/1071 |
| 2016/0294361 A1* | 10/2016 | Yamane | | H03H 9/02574 |
| 2016/0380611 A1* | 12/2016 | Kai | | H03H 9/02574 |
| | | | | 310/313 B |
| 2016/0380616 A1* | 12/2016 | Takamine | | H03H 9/02574 |
| | | | | 333/133 |
| 2017/0005638 A1* | 1/2017 | Otagawa | | H03H 9/02574 |
| 2017/0077897 A1* | 3/2017 | Otsubo | | H01L 41/18 |
| 2017/0093371 A1* | 3/2017 | Takamine | | H03H 9/64 |
| 2017/0244431 A1* | 8/2017 | Araki | | H04B 1/0057 |
| 2018/0152210 A1* | 5/2018 | Araki | | H04B 1/0057 |

* cited by examiner

FIG. 9

ELASTIC WAVE DEVICE, MULTIPLEXER, HIGH-FREQUENCY FRONT-END CIRCUIT, AND COMMUNICATION APPARATUS

CROSS REFERENCE TO RELATED APPLICATIONS

This application claims the benefit of priority to Japanese Patent Application No. 2018-025832 filed on Feb. 16, 2018. The entire contents of this application are hereby incorporated herein by reference.

BACKGROUND OF THE INVENTION

1. Field of the Invention

The present invention relates to an elastic wave device, a multiplexer, a high-frequency front-end circuit, and a communication apparatus.

2. Description of the Related Art

Elastic wave devices have been widely used for, for example, filters of cellular phones. International Publication No. 2012/086639 discloses an example of an elastic wave device. The elastic wave device includes a multilayer body in which a supporting substrate, a high-acoustic-velocity film, a low-acoustic-velocity film, and a piezoelectric film are stacked in this order. An interdigital transducer electrode is disposed on the piezoelectric film. In International Publication No. 2012/086639, silicon nitride is exemplified as a material used for the high-acoustic-velocity film.

In the case of the elastic wave device in which the supporting substrate, the high-acoustic-velocity film, the low-acoustic-velocity film, and the piezoelectric film are stacked in this order, an elastic wave in which a wave having a lower acoustic velocity than the acoustic velocity of a bulk wave that propagates through the high-acoustic-velocity film is used as a main mode is confined to the side of the piezoelectric film rather than the high-acoustic-velocity film. In a high-order excitation mode (high-order mode) in which a wave having an acoustic velocity equal to or higher than a bulk wave that propagates through the high-acoustic-velocity film is used as a main mode, the energy of the elastic wave may also be distributed in the high-acoustic-velocity film. Thus, if the physical properties of silicon nitride included in the high-acoustic-velocity film are changed, a problem such as a change in high-order-mode frequency may arise. In the case in which such an elastic wave device is used in, for example, a multiplexer, a high-order-mode unwanted wave is generated within the pass band of another filter device connected in common to an antenna.

SUMMARY OF THE INVENTION

Preferred embodiments of the present invention provide elastic wave devices, multiplexers, high-frequency front-end circuits, and communication apparatuses that are each capable of reducing or preventing a high-order-mode unwanted wave and reducing or preventing a change in high-order-mode frequency.

According to a preferred embodiment of the present invention, an elastic wave device includes a supporting substrate, a high-acoustic-velocity film disposed on the supporting substrate, a low-acoustic-velocity film disposed on the high-acoustic-velocity film, a piezoelectric layer disposed on the low-acoustic-velocity film, and an interdigital transducer electrode disposed on the piezoelectric layer, in which the acoustic velocity of a bulk wave that propagates through the high-acoustic-velocity film is higher than the acoustic velocity of an elastic wave that propagates through the piezoelectric layer, the acoustic velocity of a bulk wave that propagates through the low-acoustic-velocity film is lower than the acoustic velocity of an elastic wave that propagates through the piezoelectric layer, and the high-acoustic-velocity film is made of $SiN_x$, where x<about 0.67.

In an elastic wave device according to a preferred embodiment of the present invention, the low-acoustic-velocity film may be made of silicon oxide. In this case, the elastic wave device is able to have a reduced absolute value of the temperature coefficient of resonant frequency (TCF) and improved temperature characteristics.

In an elastic wave device according to a preferred embodiment of the present invention, the low-acoustic-velocity film may be a first low-acoustic-velocity film, and the elastic wave device may further include a second low-acoustic-velocity film disposed between the supporting substrate and the high-acoustic-velocity film. The acoustic velocity of a bulk wave that propagates through the second low-acoustic-velocity film is lower than the acoustic velocity of an elastic wave that propagates through the piezoelectric layer.

In an elastic wave device according to a preferred embodiment of the present invention, the second low-acoustic-velocity film may be made of silicon oxide.

An elastic wave device according to a preferred embodiment of the present invention may further include an insulating film disposed between the piezoelectric layer and the interdigital transducer electrode.

A multiplexer according to a preferred embodiment of the present invention includes an antenna terminal to be connected to an antenna, and band-pass filters connected in common to the antenna terminal and having different pass bands. Among the band-pass filters, at least one band-pass filter other than a band-pass filter having a pass band located on the highest frequency side includes an elastic wave device according to a preferred embodiment of the present invention.

A high-frequency front-end circuit according to a preferred embodiment of the present invention includes an elastic wave device according to a preferred embodiment of the present invention and a power amplifier.

A communication apparatus according to a preferred embodiment of the present invention includes a high-frequency front-end circuit according to a preferred embodiment of the present invention, and an RF signal processing circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments according to the present invention will be described below with reference to the accompanying drawings so as to clarify the present invention.

Preferred embodiments described herein are illustrative. It should be noted that partial replacement and combination of configurations in different preferred embodiments may be made.

Figure 1:
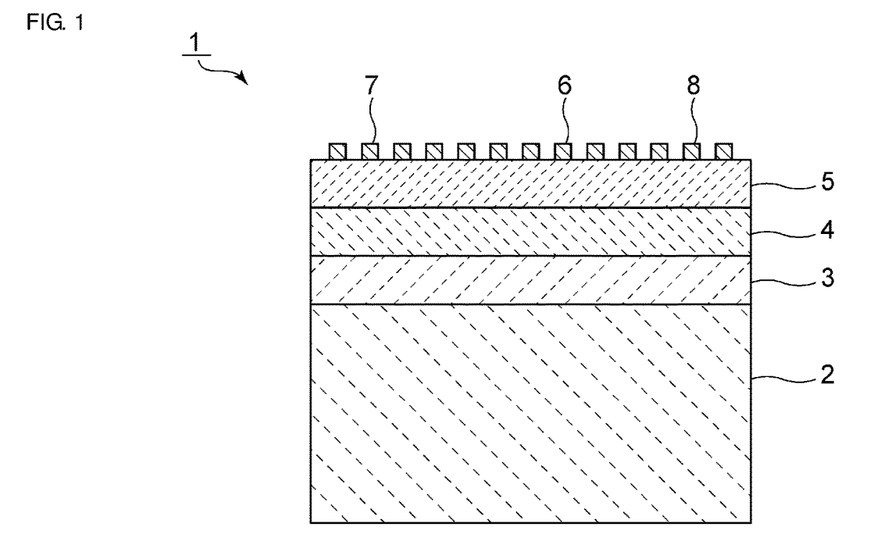
FIG. 1 is an elevational cross-sectional view of an elastic wave device according to a first preferred embodiment of the present invention.
Figure 2:
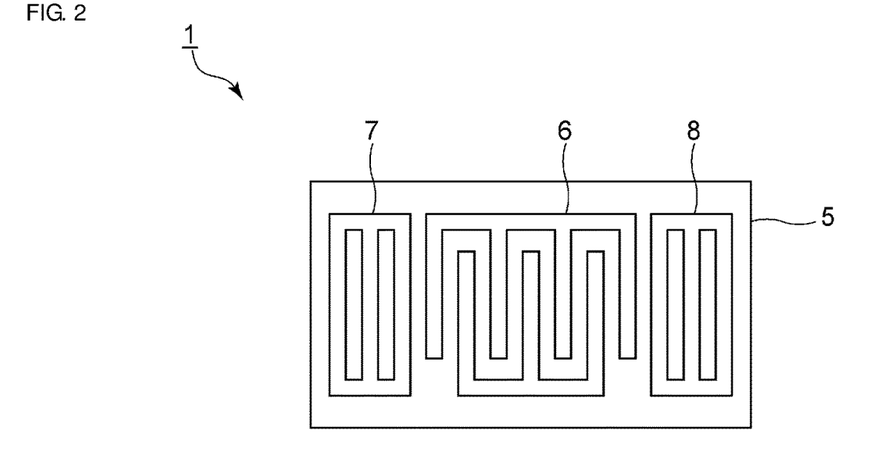
FIG. 2 is a plan view of the elastic wave device according to the first preferred embodiment of the present invention.

FIG. 1 is an elevational cross-sectional view of an elastic wave device according to a first preferred embodiment of the present invention. FIG. 2 is a plan view of the elastic wave device according to the first preferred embodiment.

As illustrated in FIG. 1, an elastic wave device 1 includes a supporting substrate 2. The supporting substrate 2 is preferably made of silicon (Si), for example. The supporting substrate 2 may be made of, for example, aluminum oxide, diamond, sapphire, a piezoelectric material such as lithium tantalate, lithium niobate, or quartz crystal, a ceramic material such as alumina, magnesia, silicon nitride, aluminum nitride, silicon carbide, zirconia, cordierite, mullite, steatite, or forsterite, a dielectric material such as glass, a semiconductor material such as gallium nitride, or a resin.

A high-acoustic-velocity film 3, a low-acoustic-velocity film 4, and a piezoelectric layer 5 are stacked, in this order, on the supporting substrate 2. An interdigital transducer electrode 6 is disposed on the piezoelectric layer 5. The application of an alternating-current voltage to the interdigital transducer electrode 6 excites an elastic wave.

As illustrated in FIG. 2, a reflector 7 and a reflector 8 are disposed on the respective side portions of the interdigital transducer electrode 6 in the elastic wave propagation direction. Examples of a material usable for the interdigital transducer electrode 6 and the reflectors 7 and 8 include Al, Cu, Pt, Au, Ag, Ti, Ni, Cr, Mo, and W. Each of the interdigital transducer electrode 6 and the reflectors 7 and 8 may include a single-layer metal film or a multilayer metal film in which metal layers are stacked. The elastic wave device 1 according to the present preferred embodiment is preferably an elastic wave resonator. The elastic wave device according to a preferred embodiment of the present invention is not limited to the elastic wave resonator. For example, preferred embodiments of the present invention may also be applied to an elastic wave device such as a longitudinally coupled resonator filter.

The piezoelectric layer 5 illustrated in FIG. 1 may preferably be made of, for example, a single crystal of a piezoelectric material such as lithium niobate ($LiNbO_3$) or lithium tantalate ($LiTaO_3$) or a piezoelectric ceramic material such as ZnO, AlN, or PZT. Here, letting a wavelength determined by the electrode finger pitch of the interdigital transducer electrode 6 be $\lambda$, the piezoelectric layer 5 preferably has a film thickness of about $3.5\lambda$ or less, for example. In this case, the quality factor Q is able to be sufficiently increased.

The high-acoustic-velocity film 3 is a film in which the acoustic velocity of a bulk wave that propagates through the high-acoustic-velocity film 3 is higher than the acoustic velocity of an elastic wave that propagates through the piezoelectric layer 5. The high-acoustic-velocity film 3 according to the present preferred embodiment is made of silicon nitride. Specifically, the high-acoustic-velocity film 3 is preferably of $SiN_x$, where x<about 0.67, for example.

The low-acoustic-velocity film 4 is a film in which the acoustic velocity of a bulk wave that propagates through the low-acoustic-velocity film 4 is lower than the acoustic velocity of an elastic wave that propagates through the piezoelectric layer 5. The low-acoustic-velocity film 4 according to the present preferred embodiment is made of, but not particularly limited to, silicon oxide expressed as $SiO_y$, for example. Specifically, the low-acoustic-velocity film 4 is preferably made of $SiO_2$ in which y=about 2, for example. Because the low-acoustic-velocity film 4 according to the present preferred embodiment is made of silicon oxide, the elastic wave device 1 has a reduced absolute value of the temperature coefficient of resonant frequency (TCF) and improved temperature characteristics.

The low-acoustic-velocity film 4 may also be made of, for example, a medium mainly including glass, silicon oxynitride, tantalum oxide, or a compound including a silicon oxide doped with fluorine, carbon, or boron. Any material in which an acoustic velocity is relatively low may be used for the low-acoustic-velocity film 4.

The elastic wave device 1 has a multilayer structure in which the high-acoustic-velocity film 3, the low-acoustic-velocity film 4, and the piezoelectric layer 5 are stacked in this order. Thus, the energy of an elastic wave is effectively confined to the piezoelectric layer 5 side.

High-order-mode energy is also confined to the piezoelectric layer 5 side. Thus, in the elastic wave device 1 having the multilayer structure in which the high-acoustic-velocity film 3, the low-acoustic-velocity film 4, and the piezoelectric layer 5 are stacked in this order, a predetermined countermeasure for the high-order mode is required.

The elastic wave device 1 according to the present preferred embodiment includes the supporting substrate 2, the high-acoustic-velocity film 3 disposed on the supporting substrate 2, the low-acoustic-velocity film 4 disposed on the high-acoustic-velocity film 3, the piezoelectric layer 5 disposed on the low-acoustic-velocity film 4, and the interdigital transducer electrode 6 disposed on the piezoelectric layer 5, in which the acoustic velocity of a bulk wave that propagates through the high-acoustic-velocity film 3 is higher than the acoustic velocity of an elastic wave that propagates through the piezoelectric layer 5, the acoustic velocity of a bulk wave that propagates through the low-acoustic-velocity film 4 is lower than the acoustic velocity of an elastic wave that propagates through the piezoelectric layer 5, and the high-acoustic-velocity film 3 is made of $SiN_x$, where x<about 0.67. This reduces or prevents a high-order-mode unwanted wave and a change in high-order-mode frequency. This will be described below.

The high-order-mode energy is distributed in the high-acoustic-velocity film 3. Thus, changes in the elastic constant, the density, and other characteristics of the high-acoustic-velocity film 3 are particularly likely to cause changes in electrical characteristics in the high-order mode. Changes in the material constants of the high-acoustic-velocity film 3 are mainly caused by moisture absorption.

In the present preferred embodiment, the high-acoustic-velocity film 3 is preferably made of $SiN_x$, where x<about 0.67, for example. This reduces or prevents a change in the composition of the high-acoustic-velocity film 3 due to, for example, moisture absorption and reduces or prevents changes in elastic constant, density, and other characteristics. Thus, a change in frequency at which a high-order mode unwanted wave is generated is reduced or prevented, and deviations from the design value of the frequency do not easily occur. Accordingly, for example, in the case in which the elastic wave device 1 is used for a multiplexer, for example, the influence of an unwanted wave on other filter devices connected in common to, for example, an antenna is reduced or prevented. In addition, because the elastic wave device 1 has a structure according to the present preferred embodiment, the level of a high-order-mode unwanted wave is also reduced. These effects will be described in more detail below with reference to FIGS. 3 and 4.

Figure 3:
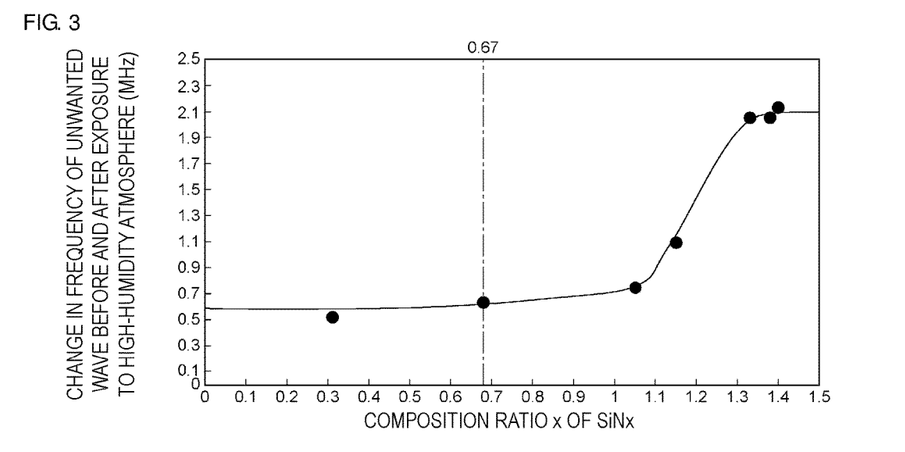
FIG. 3 is a graph illustrating the relationship between a change in the frequency of a high-order-mode unwanted wave in an elastic wave device before and after exposure to a high-humidity atmosphere and the composition ratio x of a high-acoustic-velocity film made of $SiN_x$.

An elastic wave device having the structure according to the first preferred embodiment was produced. Elastic wave devices having the same or substantially the same structure as in the first preferred embodiment were produced, except that different composition ratios x of $SiN_x$ were used. In each of the elastic wave devices, a frequency at which a high-order-mode unwanted wave was generated was measured. These elastic wave devices were allowed to stand in a high-humidity atmosphere with a temperature of about 85° C. and a humidity of about 85% for about 500 hours. In each elastic wave device, a frequency at which a high-order-mode unwanted wave was generated was measured again. A change in frequency at which the high-order-mode unwanted wave was generated before and after exposure to the high-humidity atmosphere was calculated. FIG. 3 illustrates the results.

FIG. 3 is a graph illustrating the relationship between a change in the frequency of the high-order-mode unwanted wave in each elastic wave device before and after exposure to the high-humidity atmosphere and the composition ratio x of the high-acoustic-velocity film composed of $SiN_x$.

As illustrated in FIG. 3, when, for example, x≥about 1.1, where x represents the composition ratio of the high-acoustic-velocity film made of $SiN_x$, the change in frequency at which the high-order-mode unwanted wave is generated is large. When x<about 1.1, for example, the change in frequency at which the high-order-mode unwanted wave is generated is small. As in the present preferred embodiment, when x<about 0.67, for example, the change in frequency at which the high-order-mode unwanted wave is generated is smaller. Accordingly, the change in high-order-mode frequency in the elastic wave device 1 is able to be reduced or prevented.

Figure 4:
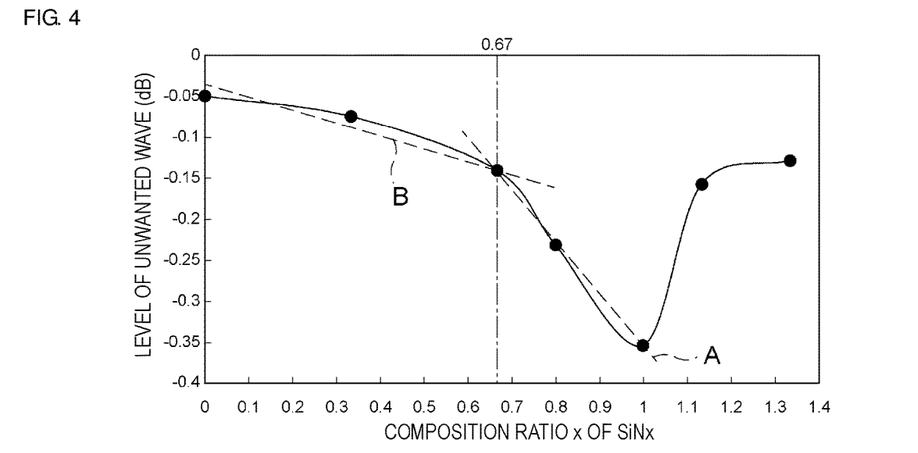
FIG. 4 is a graph illustrating the relationship between the level of a high-order-mode unwanted wave in an elastic wave device and the composition ratio x of a high-acoustic-velocity film made of $SiN_x$.

Elastic wave devices having different composition ratios x were produced in the same or similar manner as above. Levels of unwanted waves in these elastic wave devices were measured. FIG. 4 illustrates the results.

FIG. 4 is a graph illustrating the relationship between the level of a high-order-mode unwanted wave in each elastic wave device and the composition ratio x of a high-acoustic-velocity film made of $SiN_x$.

FIG. 4 indicates that when the composition ratio x<about 0.67, for example, as in the present preferred embodiment, the absolute value of the level of the unwanted wave is smaller than that when about 0.67<x<about 1, for example. As indicated by broken lines A and B, when the composition ratio x<about 0.67, the rate of increase of the absolute value of the level of the unwanted wave with respect to the composition ratio x is lower than that when about 0.67<x<about 1. Accordingly, the high-order-mode unwanted wave is able to be effectively reduced or prevented in the present preferred embodiment.

A dielectric film may be disposed on the piezoelectric layer 5 illustrated in FIG. 1 so as to cover the interdigital transducer electrode 6 and the reflectors 7 and 8. This reduces or prevents damage to the interdigital transducer electrode 6. Non-limiting examples of a material for the dielectric film include silicon oxide, silicon oxynitride, tantalum oxide, silicon nitride, and a compound including a silicon oxide doped with fluorine, carbon, or boron.

Figure 5:
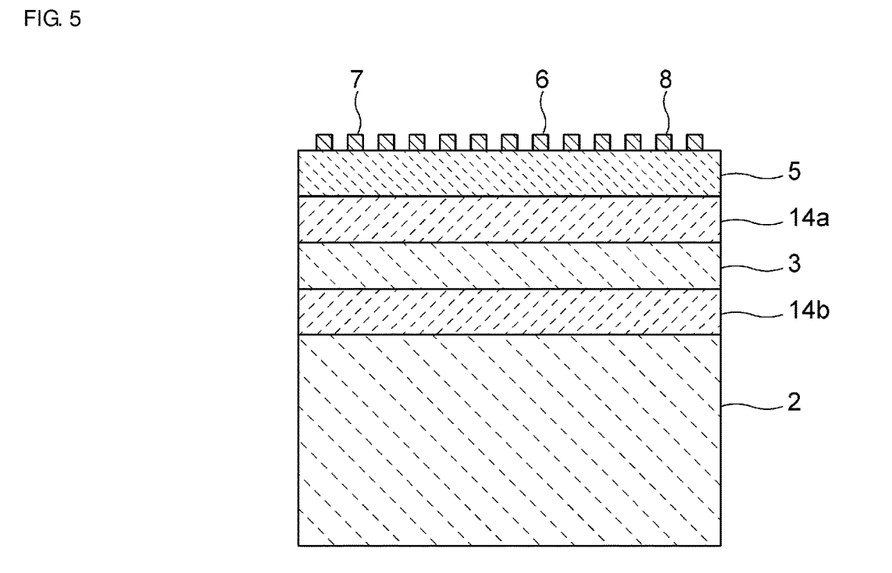
FIG. 5 is an elevational cross-sectional view of an elastic wave device according to a second preferred embodiment of the present invention.

FIG. 5 is an elevational cross-sectional view of an elastic wave device according to a second preferred embodiment of the present invention.

In the present preferred embodiment, a low-acoustic-velocity film corresponding to the low-acoustic-velocity film 4 according to the first preferred embodiment as illustrated in FIG. 1 is a first low-acoustic-velocity film 14a. The present preferred embodiment differs from the first preferred embodiment in that a second low-acoustic-velocity film 14b is included. Except for the above point, the acoustic wave device of the present preferred embodiment has the same or substantially the same structure as the elastic wave device 1 according to the first preferred embodiment.

The second low-acoustic-velocity film 14b is disposed between the supporting substrate 2 and the high-acoustic-velocity film 3 and is a film in which the acoustic velocity of a bulk wave that propagates through the high-acoustic-velocity film 3 is lower than the acoustic velocity of an elastic wave that propagates through the piezoelectric layer 5. The second low-acoustic-velocity film 14b according to the present preferred embodiment is preferably made of, but not particularly limited to, silicon oxide, for example. The second low-acoustic-velocity film 14b may also be made of, for example, a medium mainly including glass, silicon oxynitride, tantalum oxide, or a compound including a silicon oxide doped with fluorine, carbon, or boron. Any material in which an acoustic velocity is relatively low may be used for the second low-acoustic-velocity film 14b.

Also in the present preferred embodiment, because the high-acoustic-velocity film 3 is configured as in the first preferred embodiment, a high-order-mode unwanted wave is able to be reduced or prevented. Furthermore, when the elastic wave device and other filter devices are connected in common to, for example, an antenna, the influence of the unwanted wave on the filter devices is able to be reduced or prevented.

Figure 6:
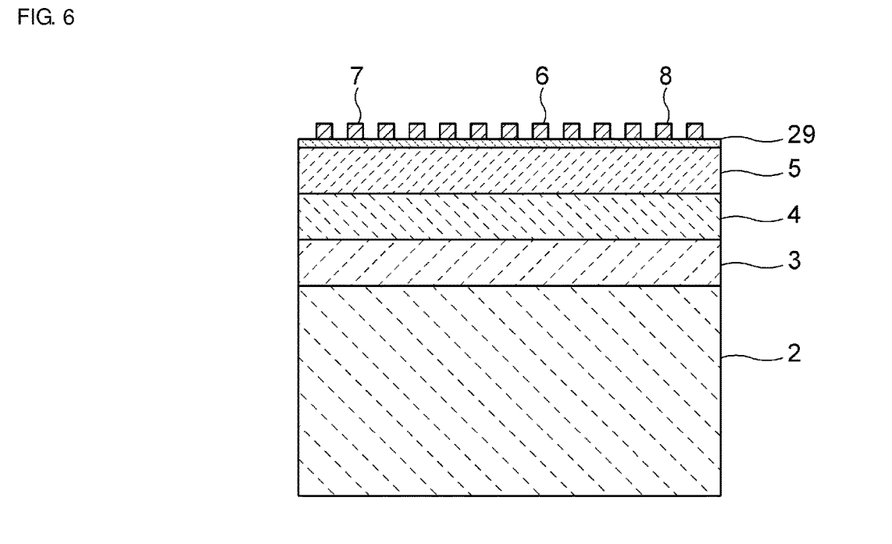
FIG. 6 is an elevational cross-sectional view of an elastic wave device according to a third preferred embodiment of the present invention.

FIG. 6 is an elevational cross-sectional view of an elastic wave device according to a third preferred embodiment of the present invention.

The present preferred embodiment differs from the first preferred embodiment in that an insulating film 29 is disposed between the piezoelectric layer 5 and the interdigital transducer electrode 6 and the reflectors 7 and 8. Except for the above point, the acoustic wave device of the present preferred embodiment has the same or substantially the same structure as the elastic wave device 1 according to the first preferred embodiment.

The insulating film 29 is preferably made of, for example, SiO$_2$, SiN, Al$_2$O$_3$, glass, silicon oxynitride, tantalum oxide, or a compound including a silicon oxide doped with fluorine, carbon, or boron. Also in the present preferred embodiment, because the high-acoustic-velocity film 3 is configured as in the first preferred embodiment, a high-order-mode unwanted wave is able to be effectively reduced or prevented.

Figure 7:
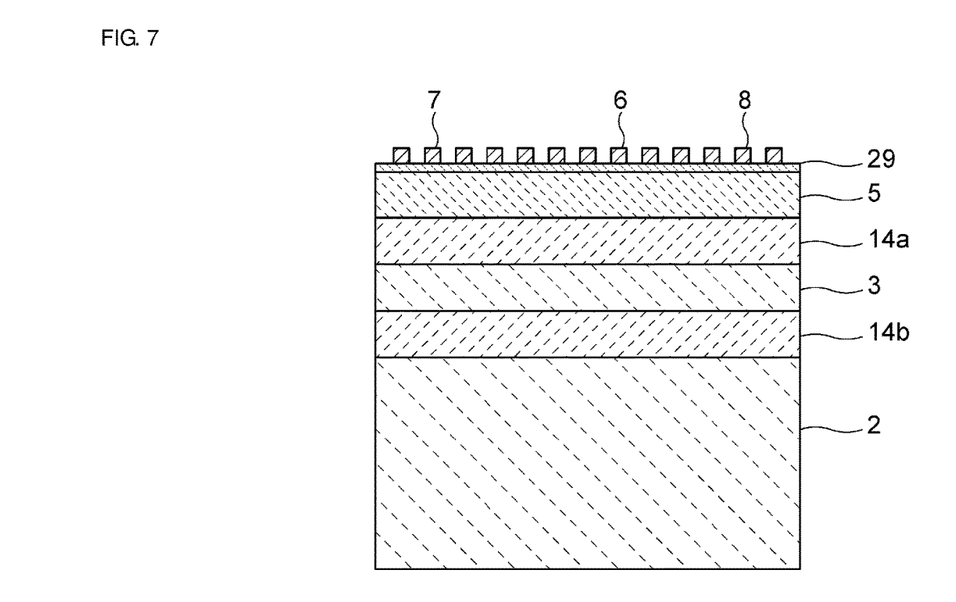
FIG. 7 is an elevational cross-sectional view of an elastic wave device according to a fourth preferred embodiment of the present invention.

FIG. 7 is an elevational cross-sectional view of an elastic wave device according to a fourth preferred embodiment of the present invention.

The present preferred embodiment differs from the second preferred embodiment in that the insulating film 29 is disposed between the piezoelectric layer 5 and the interdigital transducer electrode 6 and the reflectors 7 and 8. Except for the above point, the acoustic wave device of the present preferred embodiment has the same or substantially the same structure as the elastic wave device 1 according to the second preferred embodiment.

Also in the present preferred embodiment, because the high-acoustic-velocity film 3 is configured as in the second preferred embodiment, a high-order-mode unwanted wave is able to be reduced or prevented. Furthermore, when the elastic wave device and other filter devices are connected in common to, for example, an antenna, the influence of the unwanted wave on the filter devices is able to be reduced or prevented.

Figure 8:
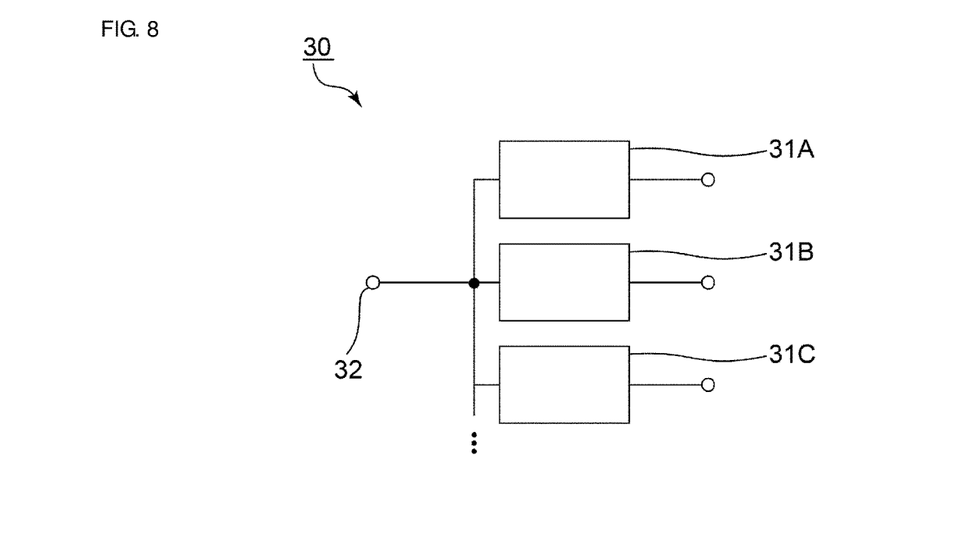
FIG. 8 is a schematic diagram of a multiplexer according to a fifth preferred embodiment of the present invention.

FIG. 8 is a schematic diagram of a multiplexer according to a fifth preferred embodiment of the present invention.

A multiplexer 30 includes an antenna terminal 32 to be connected to an antenna. The multiplexer 30 includes a first band-pass filter 31A, a second band-pass filter 31B, a third band-pass filter 31C, and other band-pass filters. The first to third band-pass filters and the other band-pass filters are connected in common to the antenna terminal 32. The multiplexer 30 may include a plurality of band-pass filters. The number of the band-pass filters is not particularly limited. Each of the band-pass filters in the multiplexer 30 may be a transmission filter or a reception filter.

The term "multiplexer" used herein includes a duplexer including two band-pass filters, for example. The multiplexer and the duplexer are separately described below, in some cases.

The first band-pass filter 31A, the second band-pass filter 31B, and the third band-pass filter 31C have different pass bands. Specifically, the pass band of the first band-pass filter 31A is located on the highest frequency side among those of the band-pass filters connected in common to the antenna terminal 32.

Among the band-pass filters, the second band-pass filter 31B, which is a band-pass filter other than the first band-pass filter 31A, includes the elastic wave device 1, defining and functioning as an elastic wave resonator, according to the first preferred embodiment. In the second band-pass filter 31B of the multiplexer 30, thus, a high-order-mode unwanted wave is able to be reduced or prevented, and a change in high-order-mode frequency is able to be reduced or prevented.

Here, although the high-order-mode unwanted wave in the second band-pass filter 31B is reduced in intensity, the high-order-mode unwanted wave is generated on a higher frequency side of the pass band of the second band-pass filter 31B. In the present preferred embodiment, the frequency of the high-order-mode unwanted wave in the second band-pass filter 31B is designed so as to be outside the pass band of the first band-pass filter 31A. The frequency of the high-order-mode unwanted wave is not easily changed and thus is able to be reliably positioned outside the pass band of the first band-pass filter 31A. Accordingly, the degradation of filter characteristics is able to be effectively reduced or prevented.

In the second band-pass filter 31B, an elastic wave resonator closest to the antenna terminal 32 preferably has the structure of the elastic wave device 1. In this case, the influence of the high-order-mode unwanted wave on the first band-pass filter 31A is able to be further reduced or prevented. All of the elastic wave resonators in the second band-pass filter 31B may preferably have the structure of the elastic wave device 1. All of the band-pass filters in the multiplexer 30 may preferably include elastic wave resonators having the structure of the elastic wave device 1.

The elastic wave devices according to the preferred embodiments described above may be used for, for example, duplexers in high-frequency front-end circuits. The present preferred embodiment will be described below.

Figure 9:
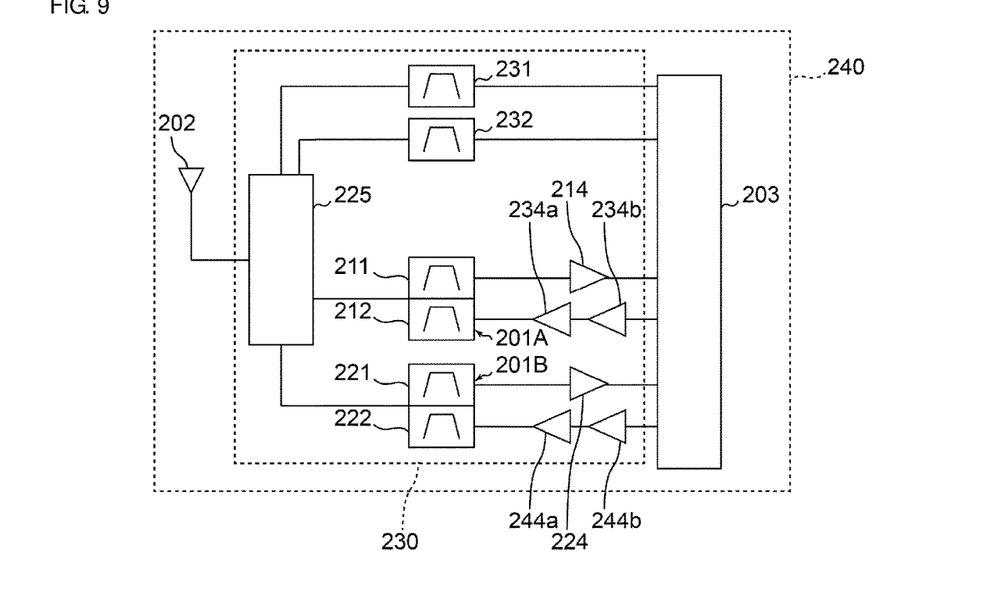
FIG. 9 is a schematic diagram of a communication apparatus including a high-frequency front-end circuit.

FIG. 9 is a schematic diagram of a communication apparatus and a high-frequency front-end circuit. FIG. 9 also illustrates components, such as an antenna element 202 and an RF signal integrated circuit (RFIC) 203, connected to a high-frequency front-end circuit 230. The high-frequency front-end circuit 230 and the RF signal integrated circuit 203 are included in a communication apparatus 240. The communication apparatus 240 may include a power source, a central processing unit (CPU), and a display.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. The high-frequency front-end circuit 230 and the communication apparatus 240 illustrated in FIG. 9 are examples of a high-frequency front-end circuit and a communication apparatus according to preferred embodiments of the present invention. The high-frequency front-end circuit and the communication apparatus are not limited to this configuration.

The duplexer 201A includes filters 211 and 212. The duplexer 201B includes filters 221 and 222. The duplexers 201A and 201B are connected to the antenna element 202 via the switch 225. An elastic wave device according to a preferred embodiment of the present invention described above may be used for the duplexers 201A and 201B or may be used for the filters 211, 212, 221, and 222.

An elastic wave device according to a preferred embodiment of the present invention described above may be used for multiplexers each including three or more filters, for example, triplexers each including three filters that share a common antenna terminal and hexaplexers including six filters that share a common antenna terminal.

Examples of elastic wave devices according to preferred embodiments of the present invention include elastic wave resonators, filters, duplexers, and multiplexers each including three or more filters. The configuration of each of the multiplexers is not limited to a configuration including both of a transmission filter and a reception filter. Each multiplexer may include only a transmission filter or only a reception filter.

The switch 225 connects the antenna element 202 to at least one signal path corresponding to a predetermined band in response to a control signal from a controller (not illustrated), and may preferably include, for example, a single-pole double-throw (SPDT) switch. The at least one signal path connected to the antenna element 202 may be a plurality of signal paths. That is, the high-frequency front-end circuit 230 may support carrier aggregation.

The low-noise amplifier circuit 214 is a reception amplifier circuit that amplifies a high-frequency signal (in this case, a high-frequency received signal) fed thereto via the antenna element 202, the switch 225, and the duplexer 201A and that feeds the amplified signal to the RF signal integrated circuit 203. The low-noise amplifier circuit 224 is a reception amplifier circuit that amplifies a high-frequency signal (in this case, a high-frequency received signal) fed thereto via the antenna element 202, the switch 225, and the duplexer 201B and that feeds the amplified signal to the RF signal integrated circuit 203.

Each of the power amplifier circuits 234a and 234b is a transmission amplifier circuit that amplifies a high-frequency signal supplied from the RF signal integrated circuit 203 (in this case, a high-frequency transmission signal) and that feeds the amplified signal to the antenna element 202 via the duplexers 201A and the switch 225. Each of the power amplifier circuits 244a and 244b is a transmission amplifier circuit that amplifies a high-frequency signal supplied from the RF signal integrated circuit 203 (in this case, a high-frequency transmission signal) and that feeds the amplified signal to the antenna element 202 via the duplexers 201B and the switch 225.

The RF signal integrated circuit 203 allows a high-frequency reception signal supplied from the antenna element 202 through a reception signal path to be subjected to signal processing such as down-conversion, for example, and feeds a reception signal generated by the signal processing. The RF signal integrated circuit 203 allows a transmission signal fed thereto to be subjected to signal processing such as up-conversion, for example, and feeds a high-frequency transmission signal generated by the signal processing to the power amplifier circuits 234a, 234b, 244a, and 244b. The RF signal integrated circuit 203 is preferably, for example, an RFIC. The communication apparatus may include a baseband integrated circuit (BBIC). In this case, the BBIC processes a reception signal that has been processed by the RFIC. The BBIC processes a transmission signal and feeds the processed signal to the RFIC. The reception signal processed by the BBIC and the transmission signal to be processed with the BBIC are preferably, for example, an image signal and an audio signal.

The high-frequency front-end circuit 230 may include duplexers according to a modification of the duplexers 201A and 201B, instead of the duplexers 201A and 201B.

The filters 231 and 232 in the communication apparatus 240 are connected between the RF signal integrated circuit 203 and the switch 225 without the low-noise amplifier circuit 214 or 224 or the power amplifier circuit 234a, 234b, 244a, or 244b. The filters 231 and 232 are also connected to the antenna element 202 via the switch 225, similarly to the duplexers 201A and 201B.

In the high-frequency front-end circuit 230 and the communication apparatus 240 having the configuration described above, the use of an elastic wave device according to a preferred embodiment of the present invention as an elastic wave resonator, a filter, a duplexer, a multiplexer including about three or more filters, or other suitable devices, reduces or prevents a high-order-mode unwanted wave. In addition, the influence of an unwanted wave on a filter device connected to the elastic wave device having the structure described above is also reduced or prevented.

The elastic wave devices, the high-frequency front-end circuits, and the communication apparatuses according to preferred embodiments of the present invention have been described. The present invention include other preferred embodiments provided by combinations of the elements in the preferred embodiments and modifications described above, modifications obtained by various modifications of the foregoing preferred embodiments conceived by those skilled in the art without departing from the gist of the present invention, and various devices including the high-frequency front-end circuit and the communication apparatus according to preferred embodiments of the present invention.

Preferred embodiments of the present invention may be widely used in, for example, communication devices, such as cellular phones, as elastic wave resonators, filters, duplexers, multiplexers that can be used in multiband systems, front-end circuits, and communication apparatuses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a supporting substrate;
   a high-acoustic-velocity film disposed on the supporting substrate;
   a low-acoustic-velocity film disposed on the high-acoustic-velocity film;
   a piezoelectric layer disposed on the low-acoustic-velocity film; and
   an interdigital transducer electrode disposed on the piezoelectric layer; wherein
   an acoustic velocity of a bulk wave that propagates through the high-acoustic-velocity film is higher than an acoustic velocity of an elastic wave that propagates through the piezoelectric layer;
   an acoustic velocity of a bulk wave that propagates through the low-acoustic-velocity film is lower than the acoustic velocity of the elastic wave that propagates through the piezoelectric layer; and
   the high-acoustic-velocity film is made of $SiN_x$, where x<about 0.67.

2. The elastic wave device according to claim 1, wherein the low-acoustic-velocity film is made of silicon oxide.

3. The elastic wave device according to claim 1, wherein the low-acoustic-velocity film is a first low-acoustic-velocity film; and
   the elastic wave device further includes a second low-acoustic-velocity film disposed between the supporting substrate and the high-acoustic-velocity film; and
   an acoustic velocity of a bulk wave that propagates through the second low-acoustic-velocity film is lower than the acoustic velocity of an elastic wave that propagates through the piezoelectric layer.

4. The elastic wave device according to claim 3, wherein the second low-acoustic-velocity film is made of silicon oxide.

5. The elastic wave device according to claim 1, further comprising:
   an insulating film disposed between the piezoelectric layer and the interdigital transducer electrode.

6. A multiplexer comprising:
   an antenna terminal to be connected to an antenna; and
   band-pass filters connected in common to the antenna terminal and having different pass bands; wherein
   among the band-pass filters, at least one band-pass filter other than a band-pass filter having a pass band located on a highest frequency side includes the elastic wave device according to claim 1.

7. The multiplexer according to claim 6, wherein the low-acoustic-velocity film is made of silicon oxide.

8. The multiplexer according to claim 6, wherein the low-acoustic-velocity film is a first low-acoustic-velocity film; and the elastic wave device further includes a second low-acoustic-velocity film disposed between the supporting substrate and the high-acoustic-velocity film; and an acoustic velocity of a bulk wave that propagates through the second low-acoustic-velocity film is lower than the acoustic velocity of an elastic wave that propagates through the piezoelectric layer.

9. The multiplexer according to claim 8, wherein the second low-acoustic-velocity film is made of silicon oxide.

10. The multiplexer according to claim 6, further comprising:

an insulating film disposed between the piezoelectric layer and the interdigital transducer electrode.

11. A high-frequency front-end circuit comprising:
the elastic wave device according to claim 1; and
a power amplifier.

12. The high-frequency front-end circuit according to claim 11, wherein the low-acoustic-velocity film is made of silicon oxide.

13. The high-frequency front-end circuit according to claim 11, wherein the low-acoustic-velocity film is a first low-acoustic-velocity film; and the elastic wave device further includes a second low-acoustic-velocity film disposed between the supporting substrate and the high-acoustic-velocity film; and an acoustic velocity of a bulk wave that propagates through the second low-acoustic-velocity film is lower than the acoustic velocity of an elastic wave that propagates through the piezoelectric layer.

14. The high-frequency front-end circuit according to claim 13, wherein the second low-acoustic-velocity film is made of silicon oxide.

15. The high-frequency front-end circuit according to claim 11, further comprising:

an insulating film disposed between the piezoelectric layer and the interdigital transducer electrode.

16. A communication apparatus comprising:
the high-frequency front-end circuit according to claim 11; and
an RF signal processing circuit.

17. The communication apparatus according to claim 16, wherein the low-acoustic-velocity film is made of silicon oxide.

18. The communication apparatus according to claim 16, wherein the low-acoustic-velocity film is a first low-acoustic-velocity film;

the elastic wave device further includes a second low-acoustic-velocity film disposed between the supporting substrate and the high-acoustic-velocity film; and an acoustic velocity of a bulk wave that propagates through the second low-acoustic-velocity film is lower than the acoustic velocity of an elastic wave that propagates through the piezoelectric layer.

19. The communication apparatus according to claim 18, wherein the second low-acoustic-velocity film is made of silicon oxide.

20. The communication apparatus according to claim 16, further comprising:

an insulating film disposed between the piezoelectric layer and the interdigital transducer electrode.

* * * * *